United States Patent
Li et al.

(10) Patent No.: US 9,494,670 B2
(45) Date of Patent: Nov. 15, 2016

(54) METHOD FOR IMPROVING ROBUSTNESS OF 3D MAGNETIC RESONANCE IMAGING TO INVOLUNTARY MOTION

(71) Applicant: UNIVERSITAETSKLINIKUM FREIBURG, Freiburg (DE)

(72) Inventors: Guobin Li, Freiburg (DE); Juergen Hennig, Freiburg (DE); Maxim Zaitsev, Freiburg (DE)

(73) Assignee: UNIVERSITAETSKLINIKUM FREIBURG, Freiburg (DE)

( * ) Notice: Subject to any disclaimer, the term of this patent is extended or adjusted under 35 U.S.C. 154(b) by 557 days.

(21) Appl. No.: 14/052,706

(22) Filed: Oct. 12, 2013

(65) Prior Publication Data
US 2014/0125335 A1    May 8, 2014

(30) Foreign Application Priority Data

Nov. 2, 2012    (EP) .................................. 12191104

(51) Int. Cl.
*G01V 3/00*     (2006.01)
*G01R 33/565*   (2006.01)
*G01R 33/48*    (2006.01)
*G01R 33/561*   (2006.01)

(52) U.S. Cl.
CPC ..... *G01R 33/56509* (2013.01); *G01R 33/4822* (2013.01); *G01R 33/561* (2013.01)

(58) Field of Classification Search
CPC ............ G01R 33/565; G01R 33/4822; G01R 33/561
USPC ......................................................... 324/309
See application file for complete search history.

(56) References Cited

U.S. PATENT DOCUMENTS

| 6,292,684 | B1* | 9/2001  | Du ...................... G01R 33/5676 |
|           |     |         | 324/309                               |
| 7,474,097 | B2* | 1/2009  | Bydder ................ G01R 33/561    |
|           |     |         | 324/309                               |
| 2009/0082656 | A1 | 3/2009 | Bayram                                |
| 2013/0265052 | A1* | 10/2013 | Nickel ............... G01R 33/5611  |
|           |     |         | 324/309                               |

FOREIGN PATENT DOCUMENTS

| JP | 03004837 | 1/1991 |
| JP | 07194575 | 8/1995 |

OTHER PUBLICATIONS

Zhang Qiong et al., "A Motion Monitorred SPACE Sequence for Isotropic Cardotid Wall Imaging", ISMRM 2012, p. 3831.

(Continued)

*Primary Examiner* — Susan Lee
(74) *Attorney, Agent, or Firm* — Paul Vincent

(57) ABSTRACT

A method of MRI for reduction of motion artifacts in 3D MR data acquisition with multiple segments comprises: the complete acquisition being divided into two parts: basic acquisition and complementary acquisition. Basic acquisition is performed at the beginning. Complementary acquisition is performed after the basic acquisition is finished. View Reordering is prepared for basic acquisition and complementary acquisition separately. Motion monitoring is performed regularly during the data acquisition. Whenever motion is detected, data acquisition stops. Image reconstruction is performed when motion occurs in the phase of complementary acquisition. The final reconstructed image is free of motion artifacts.

12 Claims, 3 Drawing Sheets

(56) References Cited

OTHER PUBLICATIONS

Hadizadeh Dariusch R. et al., "View-sharing in keyhole imaging: Partially compressed central k-space acquisition in time-resolved MRA at 3.0T", European Journal of Radiology 80 (2011) 400-406.
Johnson Casey P. et al., "Buildup of Image Quality in View-Shared Time-Resolved 3D CE-MRA", Magnetic Resonance in Medicine 70:348-357 (2013).
Lustig Michael et al., "Compressed Sensing MRI", Signal Processing Magazine, IEEE, vol. 25, No. 2, pp. 72-82, Mar. 2008.
Busse Reed F. et al., "Effects of Refocusing Flip Angle Modulation and View Ordering in 3D Fast Spin Echo", Magnetic Resonance in Medicine 60:640-649 (2008).
Basse-Luesebrink T.C. et al., "Application of Compressed Sensing to $^{19}$F turbo spin echo chemical shift imaging", Proc. Intl. Soc. Mag. Reson.Med. 19 (2011).
Wilman, Alan H. et al., "Performance of an Elliptical Centric View Order for Signal Enhancement and Motion Artifact Suppression in Breath-hold Three-Dimensional Gradient Echo Imaging", MRM 38:793-802 (1997).
Cukur, Tolga et al., "Signal Compensation and Compressed Sensing for Magnetization-Prepared MR Angiography", IEEE Transactions on Medical Imaging, vol. 30, No. 5, May 5, 2011.
Gdaniec, Nadine et al., "Novel Sampling Strategy for Abdominal Imaging with Incomplete Breathholds", Proc. Intl. Soc. Mag. Reson. Med. 20 (2012).

\* cited by examiner

METHOD FOR IMPROVING ROBUSTNESS OF 3D MAGNETIC RESONANCE IMAGING TO INVOLUNTARY MOTION

This application claims Paris convention priority of EP 12 191 104.4 filed Nov. 2, 2012 the entire disclosure of which is hereby incorporated by reference.

BACKGROUND OF THE INVENTION

The present invention relates to a method of magnetic resonance imaging (=MRI) technology for reduction of motion related artifacts in 3D MR data acquisition with multiple segments. In particular, the invention pertains to a method of magnetic resonance (=MR) imaging for the acquisition of a three-dimensional (=3D) dataset of an object of investigation, where spatial encoding by three mutually orthogonal magnetic field gradients is performed such, that signal is readout under a read-gradient in one spatial direction and spatial encoding in the other two spatial directions is performed by applying phase encoding gradients in the other two spatial directions prior to signal acquisition and data acquisition is performed in a sequential manner such, that at each acquisition step signal is acquired under said readout gradient, but with different combinations of the two phase encoding gradients.

Such method is known from reference [3] (Busse et al.).

The scan time of 3D MRI is long and is prone to artifacts caused by patient motion. Recently developed k-space random sampling techniques (also known as Compressed Sensing, see reference [2]) support the image reconstruction using randomly sampled k-space datasets. Recently developed view reordering (see reference [3]) supports the flexible filling of 3D gridded k-space with multiple segments. In a recently developed method for dynamic MR angiography progressive filling of k-space is performed to allow for a trade-off of temporal resolution and image sharpness (see reference [4]). Navigator echo (see reference [5]) is an easy and reliable way for motion detection, which was already used to monitor the respiration motion, swallowing cased motion etc.

To the present moment no method for 3D structural imaging is known which is capable of being interrupted due to the patient's or subject's motion, where it would be possible to reconstruct high quality anatomic images with only partial data and where the quality of the complete data set would not be compromised to allow for the flexibility of interrupting the scan.

An object of the present invention is to propose a method for reduction of motion related artifacts in 3D MR data acquisition, where data are acquired under a readout gradient for spatial encoding in the first spatial dimension (referred to as $K_1$). Data in the $2^{nd}$ and $3^{rd}$ spatial dimension are spatially encoded according using two mutually orthogonal phase encoding gradients (referred to as $K_2$ and $K_3$). The invention applies to any MR sequence suitable for this spatial encoding strategy. This includes 3D-acquisition with steady state techniques like gradient echoes, contrast prepared gradient echo techniques like MDEFT and MPRAGE as well as 3D-multiecho-techniques (3D-TSE, SPACE).

SUMMARY OF THE INVENTION

According to the present invention, these objects are achieved by modifying the initially defined generic method in that the temporal sequence of spatial encoding is applied such, that first a basic dataset containing $N_{3D(b)}$ phase encoding steps is acquired using a randomized sampling pattern in the two phase encoding directions, where the sampling density of the randomized sampling pattern decreases monotonically from the center of k-space to generate a first dataset suitable for reconstruction of strongly undersampled data by use of the compressed sensing method to generate a first 3D image volume of the object of investigation with a predefined sufficient minimum quality, that data acquisition then proceeds by acquiring a complimentary dataset in which $N_{3D(c)}$ additional phase encoding steps are acquired supplementing the already acquired data such, that the density of sampling points is increased allowing the reconstruction of 3D-image volumes of increasing image quality until data are acquired with a predefined sampling density to reconstruct a final 3D-volume of optimum quality, that spatial encoding in the acquisition of the basic as well as the complimentary dataset is performed in a segmented fashion in L segments with $N_{seg}$ phase encoding steps in each segment, in which the total k-space sampling pattern of the basic or complimentary dataset is subdivided into a predefined number of $N_{seg}$ sectors containing L phase encoding steps each and for the acquisition of each phase encoding step in each segment one phase encoding step is selected from each sector such that each segment contains one phase encoding step from each sector, and that suitable monitoring of motion of the object of investigation is applied such that data acquisition is terminated whenever involuntary motion exceeds a predefined threshold, where motion monitoring is performed either using navigators built into the measurement method or by extrinsic motion detection devices.

In order to achieve the above mentioned objective, the present invention proposes a method comprising the following steps: the complete acquisition is divided into two parts: basic acquisition and complementary acquisition. Basic acquisition is performed at the beginning. Complementary acquisition is performed immediately after the basic acquisition is finished. The selection and sequence of phase encoding sampling points in the $K_2$-$K_3$-plane ('view ordering') is prepared for basic acquisition and complementary acquisition separately. Motion monitoring is performed regularly during the data acquisition. When motional displacement above a predefined threshold is detected, MR data acquisition stops. Image reconstruction is performed when motion occurs in the phase of complementary acquisition.

K-space data acquired in said complete acquisition is randomly sampled in the $K_2$-$K_3$-plane, and compressed Sensing reconstruction is used. The view ordering is optimized using the theory in Compressed Sensing. The amount of acquired data is determined empirically by the optimally desired image quality.

K-space data acquired in said basic acquisition is randomly sampled. Data acquired in the basic acquisition is a subset of the data acquired in the complete acquisition. The sampling pattern is optimized using the theory in Compressed Sensing. The amount of acquired data is determined empirically by the lowest acceptable image quality.

Said complementary acquisition is the acquisition of data acquired in complete acquisition, but not acquired in basic acquisition.

Said view reordering comprises:

First random sampling patterns with $N_{3D(b)}$ phase encoding points for the basic acquisition and $N_{3D(c)}$ phase encoding points for the complimentary acquisition are created. Sampling patterns for basic and complimentary acquisition are defined independently with the boundary condition that each phase encoding step is acquired only once.

The thus defined sampled k-space for each type of acquisition is subdivided into $N_{seg}$ sectors containing L phase encoding steps each such that $L \approx N_{3D}/N_{seg}$. (Note, that L, $N_{seg}$ and $N_{3D}$ are in general different between basic and complimentary acquisition). Sectors can be either concentric (see FIG. 2) or rectilinear (see FIG. 3) to generate favorable contrast with different parameter settings, for instance, concentric sectors are favorable for proton-density weighted imaging, and rectilinear sectors are favorable for T2-weighted imaging in acquisition using 3D TSE sequences.

Said subdividing sampled k-space into Nseg sectors is performed by sorting all phase encoding points by their position in a defined direction, and equally dividing the sorted list into Nseg sectors.

Data acquisition is performed in a segmented manner in L segments with $N_{seg}$ phase encoding steps acquired in each segment.

For each segment each phase encoding step is selected from a different sector such that each segment contains one phase encoding step from each sector.

For acquisition schemes based on steady state sequences like gradient echoes the order of assignment can be arbitrary. For non-steady state acquisition schemes like TSE and contrast prepared gradient echo sequences the order of assignment follows any of the strategies described in the literature (ref. 3 and references therein).

For the selection of phase encoding points within sector different strategies can be applied: In a fully random approach points are selected randomly within each sector. In a limited random approach sectors are further subdivided into regions (see FIG. 2~4) and points are selected from corresponding regions in the different sectors. This approach can be used to minimize the length of the k-space trajectory within each segment, which may be beneficial in terms of i.e. eddy current behavior, and limitations of total gradient power.

Said View ordering of basic acquisition and complementary acquisition is prepared separately.

One option to implement the said motion monitoring is: the first echo of each train is acquired with only readout gradient; motion is detected by comparing the acquired echo to a reference echo acquired at the beginning of the basic acquisition. Significant difference of two echoes indicates the occurrence of object motion; the direction of readout gradient could be adjusted in each examination.

Another option to implement the said motion monitoring is: image reconstruction is performed regularly when new data is acquired. Motion is detected by comparing the new reconstructed image with the previous reconstructed image. Significant inconsistence of two reconstructed images indicates the occurrence of object motion.

Another option to implement the said motion monitoring is to use external devices, for example optical sensor, or a camera, breathing belt, etc.

Said image reconstruction is performed by algorithms developed in the area of Compressed Sensing technique.

Said MR data acquisition with multiple echo trains includes, but is not limited to these sequences: 3D Turbo Spin Echo sequences; 3D Gradient Echo sequences, which acquire multiple echoes after each magnetization preparation pulse, for example 3D MPRAGE.

In order to make the aforesaid and other features and advantages of the present invention more apparent to those skilled in the art, preferred embodiments of the present invention will be described in detail below by referring to the accompanying drawings, wherein identical numerals represent the same parts, and in the accompanied drawings:

DESCRIPTION OF THE PREFERRED EMBODIMENT

In order to make the object, technical solution and advantage of the present invention more apparent, the present invention will be further described in detail in conjunction with accompanying drawings and embodiments. It should be understood that the embodiments explained here are merely to explain the present invention; they are not to define the present invention.

Figure 1:
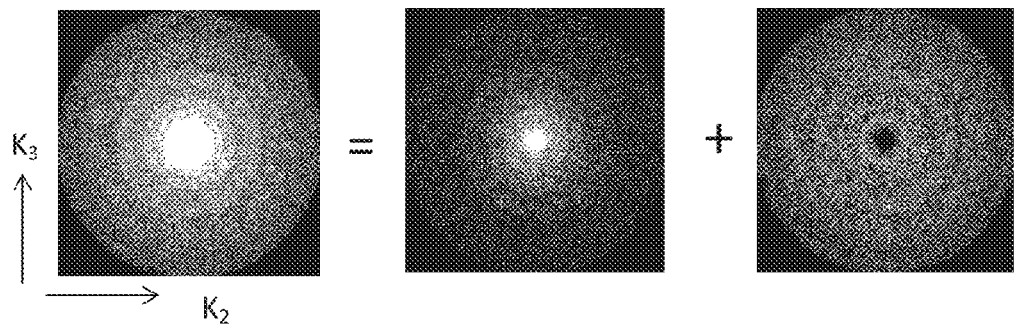
FIG. 1 is an illustration of the complete acquisition, basic acquisition, and complementary acquisition, where gridded Poisson-disk sampling is used in complete acquisition and basic acquisition.

FIG. 1 shows the complete acquisition (left) consisting of two parts: basic acquisition (middle) and complementary acquisition (right).

Figure 2:
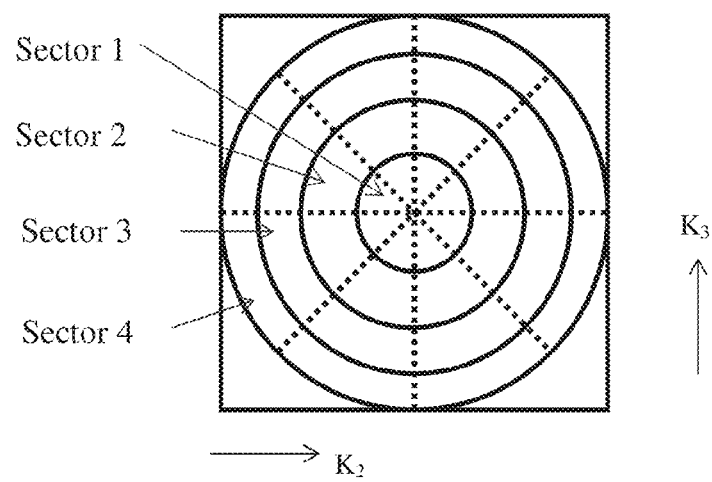
FIG. 2 is an illustration of the concentric view ordering.

FIG. 2 depicts the concentric view ordering, where k-space is divided into concentric sectors (see solid circles). Each sector is subdivided into multiple regions (see dashed lines).

Figure 3:
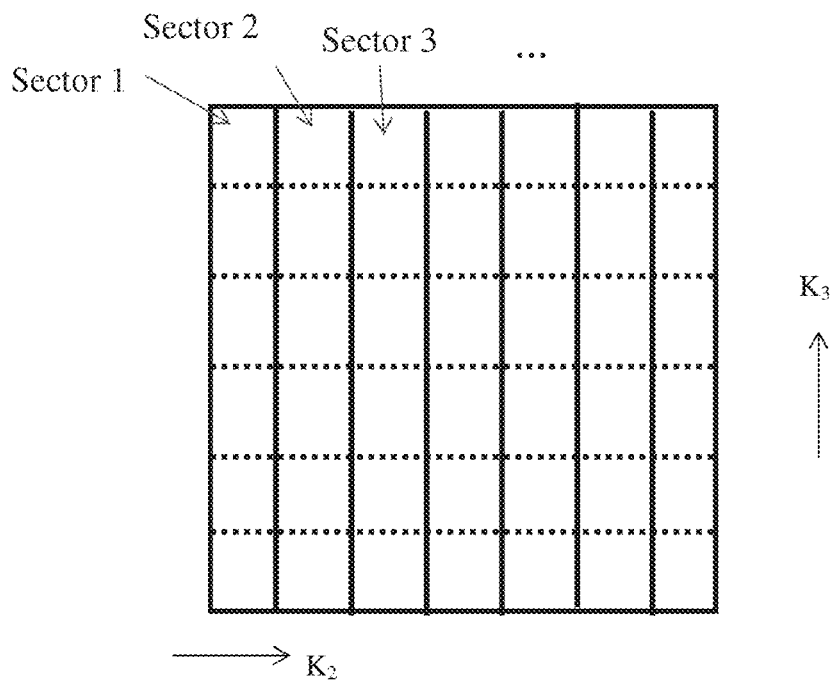
FIG. 3 is an illustration of the rectilinear view ordering.

FIG. 3 shows the rectilinear view ordering, where k-space points are divided into multiple sectors in the direction of the $2^{nd}$ phase encoding $K_2$ (see solid lines). Each sector is subdivided into multiple regions in the direction of the $3^{rd}$ phase encoding $K_3$ (see dashed lines).

Figure 4:
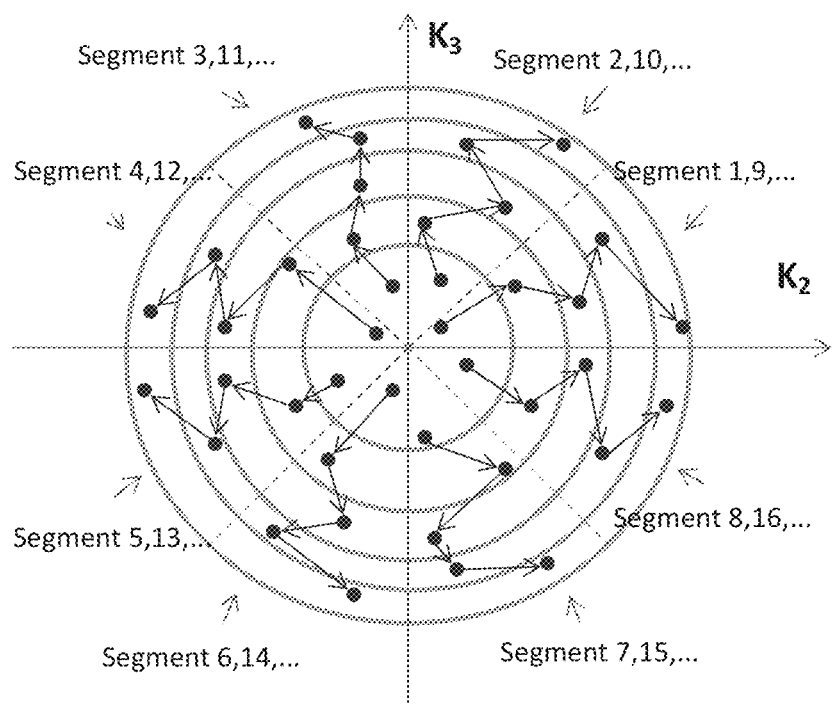
FIG. 4 is an illustration of the interleaved random trajectories used in basic acquisition and complementary acquisition.

FIG. 4 is an illustration of the concentric view ordering with limited random trajectories, where there are 5 sectors and each sector is further subdivided into 8 regions.

Figure 5:
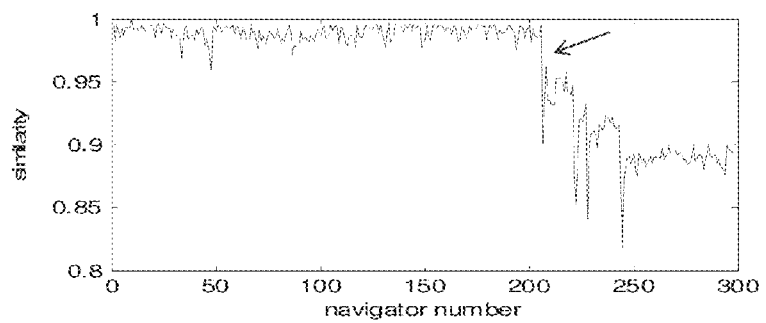
FIG. 5 illustrates the detection of motion by comparing navigator echoes acquired at the beginning of each segment.

FIG. 5 demonstrates a significant change of acquired navigators shows the time when the motion happened in the knee examination.

Figure 6:
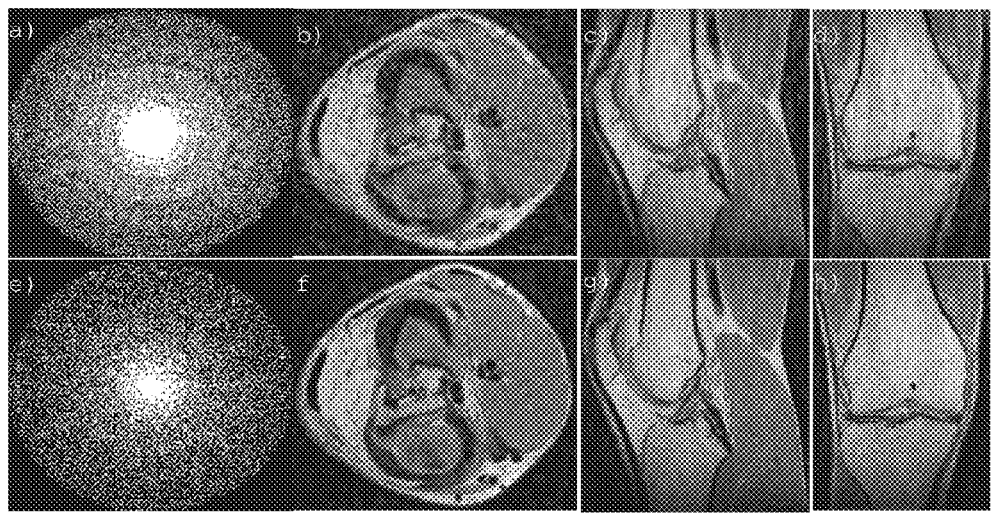
FIG. 6 shows a comparison of the reconstruction with all data, including motion corrupted data, and the reconstruction without motion corrupted data.

In FIG. 6:

a) is the k-space sampling pattern of the complete acquisition;

b)~d) are three perpendicular slices reconstructed with all acquired data;

e) is a mask showing the actually acquired k-space data before motion happened;

f)~h) are the same slices as in b)~d), but reconstructed without motion corrupted data.

In a preferred embodiment of the invention, the numbers $N_{seg}$ and L are different between the basic and the complimentary acquisition and chosen such that $N_{seg}*L \approx N_{3D(b)}$ and $N_{3D(c)}$ respectively.

In another embodiment of the invention, the sectors subdividing the k-space sampling pattern for the basic or complimentary dataset are arranged concentrically in the k-space spanned by the two phase encoding gradients.

In another embodiment of the invention, the sectors subdividing the k-space sampling pattern for the basic or complimentary dataset are rectangular.

In a class of further embodiments of the invention, the selection of phase encoding points within each sector is performed randomly within each sector.

In an alternative class of embodiments, each sector is further subdivided into regions and phase encoding points within each segment are chosen from corresponding regions.

In another class of embodiments of the invention, for data acquisition a 3D-multiecho-technique like 3D-TSE or SPACE is used such, that the echo train length is equal to $N_{seg}$.

In an alternative class of embodiments, for data acquisition a 3D-gradient echo like 3D-spoiled FLASH, 3D-FLASH, 3D-trueFISP or 3D-VIBE is used.

Still another class of embodiments of the invention is characterized in that for data acquisition a contrast prepared 3D-gradient echo technique like MPRAGE or MDEFT is used.

The present invention discloses a method for reduction of motion artifacts in 3D MR data acquisition with multiple segments, comprising: the complete acquisition is divided into two parts: basic acquisition and complementary acquisition. Basic acquisition is performed at the beginning. Complementary acquisition is performed after the basic acquisition is finished. View Reordering is prepared for basic acquisition and complementary acquisition separately. Motion monitoring is performed regularly during the data acquisition. Whenever motion is detected, data acquisition stops. Image reconstruction is performed when motion occurs in the phase of complementary acquisition. The final reconstructed image is free of motion artifacts.

REFERENCES

[1] View-sharing in keyhole imaging: Partially compressed central k-space acquisition in time-resolved MRA at 3.0 T Hadizadeh, Dariusch R.; Gieseke, Juergen; Beck, Gabriele; et al. Source: EUROPEAN JOURNAL OF RADIOLOGY Volume: 80 Issue: 2 Pages: 400-406 DOI: 10.1016/j.ejrad.2010.04.020 Published: November 2011
[2] Lustig, M.; Donoho, D. L.; Santos, J. M.; Pauly, J. M.; "Compressed Sensing MRI," *Signal Processing Magazine, IEEE*, vol. 25, no. 2, pp. 72-82, March 2008 doi: 10.1109/MSP.2007.914728
[3] Effects of refocusing flip angle modulation and view ordering in 3D fast spin echo. Busse, R. F., Brau, A. C. S., Vu, A., Michelich, C. R., Bayram, E., Kijowski, R., Reeder, S. B. and Rowley, H. A. (2008), Magnetic Resonance Medicine, 60: 640-649. doi: 10.1002/mrm.21680
[4] Buildup of Image Quality in View-Shared Time-Resolved 3D CE-MRA. Casey P. Johnson, Thomas W. Polley, James F. Glockner, Phillip M. Young, and Stephen J. Riederer. Magnet. Reson. Med. 2012 doi: 10.1002/mrm.24466
[5] A Motion Monitored SPACE Sequence for Isotropic Cardotid Wall Imaging. Zhang Q et al, ISMRM 2012, p 3831

We claim:

1. A method of magnetic resonance (=MR) imaging for the acquisition of a three-dimensional (=3D) dataset of an object of investigation, wherein spatial encoding by three mutually orthogonal magnetic field gradients is performed such that a signal is readout under a read-gradient in one spatial direction ($k_1$) and spatial encoding in the other two spatial directions ($k_2$, $k_3$) is performed by applying phase encoding gradients in the other two spatial directions ($k_2$, $k_3$) prior to signal acquisition with data acquisition being performed in a sequential manner such that, at each acquisition step, a signal is acquired under the readout gradient, but with different combinations of the two phase encoding gradients, the method comprising the steps of:
a) applying a temporal sequence of spatial encoding such that a basic dataset containing $N_{3D(b)}$ phase encoding steps is first acquired using a randomized sampling pattern in the two phase encoding directions, with the sampling density of the randomized sampling pattern decreasing monotonically from a center of k-space to generate a first dataset suitable for reconstruction of strongly undersampled data by use of a compressed sensing method to generate a first 3D image volume of the object of investigation with a predefined sufficient minimum quality;
b) acquiring a complimentary dataset in which $N_{3D(c)}$ additional phase encoding steps are acquired supplementing already acquired data such that a density of sampling points is increased, thereby allowing reconstruction of 3D-image volumes of increasing image quality until data are acquired with a predefined sampling density to reconstruct a final 3D-volume of optimum quality, wherein spatial encoding in acquisition of the basic as well as the complimentary dataset is performed in a segmented fashion in L segments with $N_{seg}$ phase encoding steps in each segment, a total k-space sampling pattern of the basic or complimentary dataset being subdivided into a predefined number of $N_{seg}$ sectors containing L phase encoding steps each and, for the acquisition of each phase encoding step in each segment, one phase encoding step is selected from each sector such that each segment contains one phase encoding step from each sector;
c) monitoring motion of the object of investigation using navigators or by extrinsic motion detection devices; and
d) terminating data acquisition whenever involuntary motion exceeds a predefined threshold.

2. The method of claim 1, wherein $N_{seg}$ and L are different between the basic and the complimentary acquisition and chosen such that $N_{seg}*L \approx N_{3D(b)}$ and $N_{3D(c)}$ respectively.

3. The method of claim 1, wherein the sectors subdividing the k-space sampling pattern for the basic or complimentary dataset are arranged concentrically in the k-space spanned by the two phase encoding gradients.

4. The method of claim 1, wherein the sectors subdividing the k-space sampling pattern for the basic or complimentary dataset are rectangular in the k-space spanned by the two phase encoding gradients.

5. The method of claim 3, wherein the phase encoding points positioned within a local averaged sampling distance from a boundary of a selected sampling region are allowed to be assigned to a neighboring region.

6. The method of claim 4, wherein the phase encoding points positioned within a local averaged sampling distance from a boundary of a selected sampling region are allowed to be assigned to a neighboring region.

7. The method of claim 1, wherein a desired k-space sampling pattern is combined with a partial Fourier acquisition, wherein only a half of k-space data is acquired along a selected direction in a k-space plane spanned by the two phase encoding gradients, with one or several additional fully sampled regions proximate to a k-space center.

8. The method of claim 1, wherein selection of phase encoding points within each sector is performed randomly within each sector.

9. The method of claim 1, wherein each sector is further subdivided into regions and phase encoding points within each segment are chosen from corresponding regions.

10. The method of claim 1, wherein for data acquisition a 3D-multiecho-technique, 3D-TSE or SPACE is used such that an echo train length is equal to $N_{seg}$.

11. The method of claim 1, wherein for data acquisition a 3D-gradient echo, 3D-spoiled FLASH, 3D-FLASH, 3D-trueFISP or 3D-VIBE is used.

12. The method of claim 1, wherein, for data acquisition, a contrast prepared 3D-gradient echo technique, MPRAGE or MDEFT is used.

* * * * *